United States Patent
Pantelias et al.

(10) Patent No.: US 9,432,143 B2
(45) Date of Patent: Aug. 30, 2016

(54) COMBINING CRC AND FEC ON A VARIABLE NUMBER OF NCPS

(71) Applicant: BROADCOM CORPORATION, Irvine, CA (US)

(72) Inventors: Niki Roberta Pantelias, Duluth, GA (US); Ba-Zhong Shen, Irvine, CA (US); Tak Kwan Lee, Irvine, CA (US); Avraham Kliger, Ramat Gan (IL); Richard Stephen Prodan, Niwot, CO (US)

(73) Assignee: Broadcom Corporation, Irvine, CA (US)

( * ) Notice: Subject to any disclaimer, the term of this patent is extended or adjusted under 35 U.S.C. 154(b) by 275 days.

(21) Appl. No.: 14/296,626

(22) Filed: Jun. 5, 2014

(65) Prior Publication Data

US 2014/0365845 A1    Dec. 11, 2014

Related U.S. Application Data

(60) Provisional application No. 61/832,120, filed on Jun. 6, 2013.

(51) Int. Cl.

| | |
|---|---|
| *H04L 1/00* | (2006.01) |
| *H03M 13/00* | (2006.01) |
| *H04L 27/26* | (2006.01) |
| *H03M 13/09* | (2006.01) |
| *H03M 13/11* | (2006.01) |
| *H03M 13/29* | (2006.01) |

(52) U.S. Cl.
CPC ............ *H04L 1/0041* (2013.01); *H03M 13/09* (2013.01); *H03M 13/116* (2013.01); *H03M 13/2915* (2013.01); *H03M 13/618* (2013.01); *H03M 13/6362* (2013.01); *H04L 1/0045* (2013.01); *H04L 1/0061* (2013.01); *H04L 1/0068* (2013.01); *H04L 1/0072* (2013.01); *H04L 27/2602* (2013.01)

(58) Field of Classification Search
None
See application file for complete search history.

(56) References Cited

U.S. PATENT DOCUMENTS

| | | | | |
|---|---|---|---|---|
| 9,088,455 | B2 * | 7/2015 | Liu | ............... H04L 29/0653 |
| 9,178,653 | B2 * | 11/2015 | Shen | ............... H04L 1/0041 |
| 9,237,084 | B2 * | 1/2016 | Chapman | ............ H04L 41/0806 |
| 2012/0192042 | A1 * | 7/2012 | Buckley | ............... H04L 1/0061 |
| | | | | 714/795 |

* cited by examiner

*Primary Examiner* — Justin R Knapp
(74) *Attorney, Agent, or Firm* — Garlick & Markison; Shayne X. Short

(57) ABSTRACT

A communication device is configured to communicate coded information to other communication device(s). The communication device uses NCPs to indicate locations of codewords within signal(s) transmitted to the other communication device(s). The communication device is configured to encode NCP(s) using an FEC code to generate coded NCP(s) and also to encode the NCP(s) using a cyclic redundancy check (CRC) code to generate NCP CRC bits. The communication device is also configured to encode the NCP CRC bits using the FEC code to generate coded NCP CRC bits. The communication device is then configured to generate OFDM or OFDMA symbol(s) include the coded NCP(s) and the coded NCP CRC bits to indicate beginnings of codeword(s) within at least one of the OFDM symbol(s) and/or additional OFDM symbol(s). The communication device is also configured to transmit the OFDM or OFDMA symbols to another communication device via a communication interface of the communication device.

20 Claims, 9 Drawing Sheets

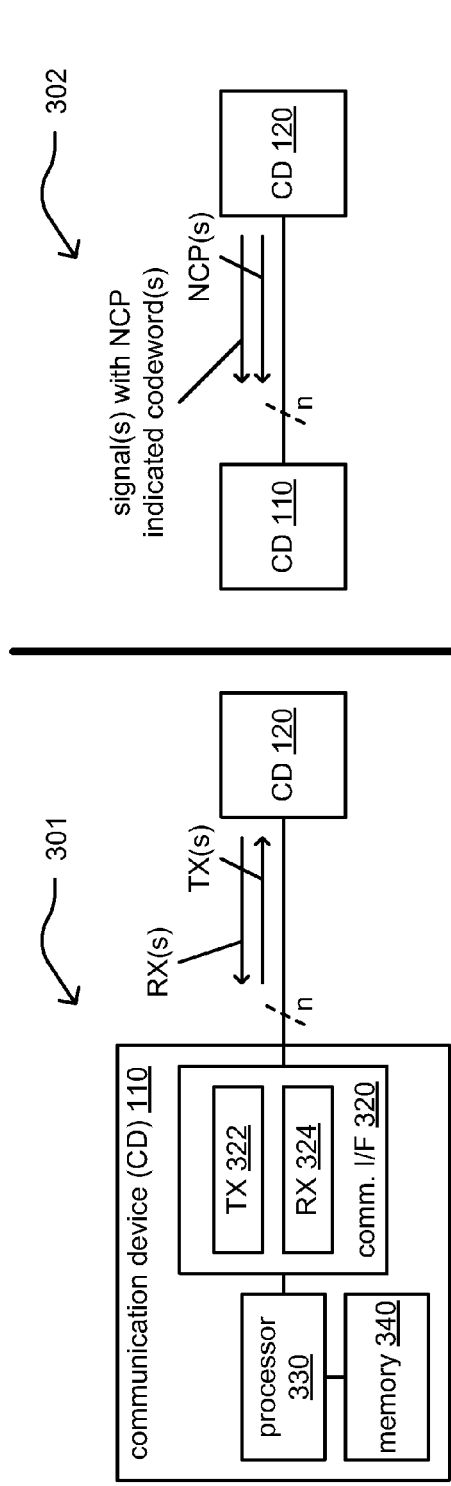
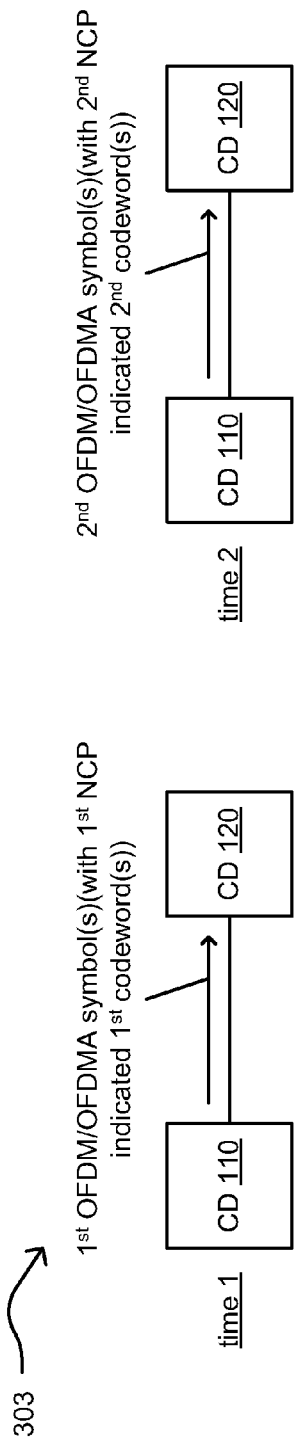
FIG. 3A
FIG. 3B
FIG. 3C

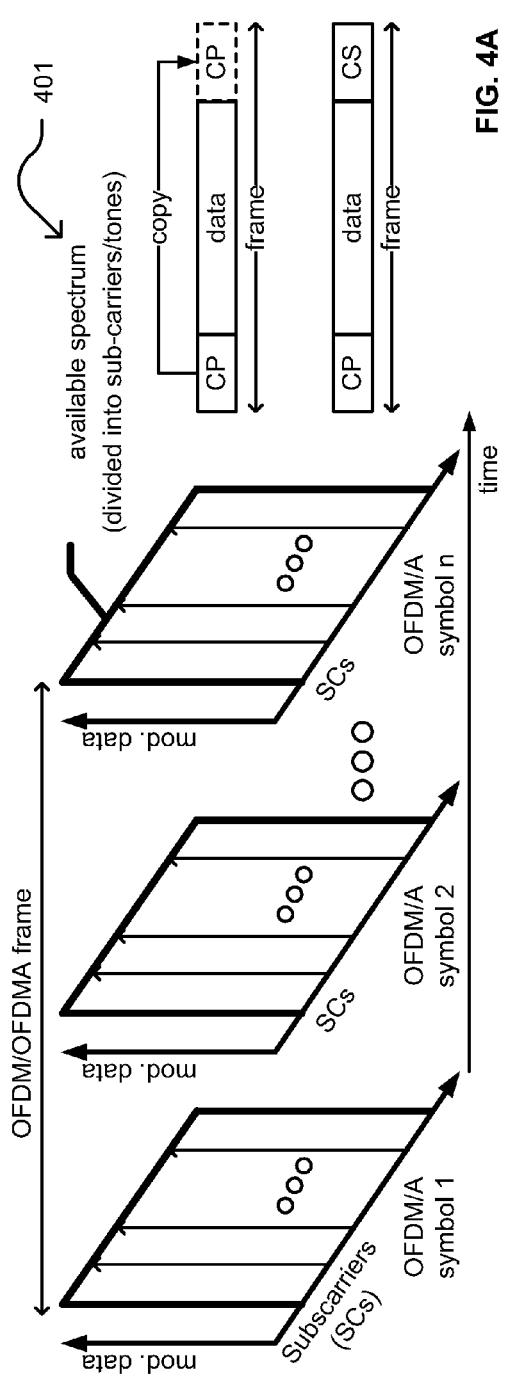
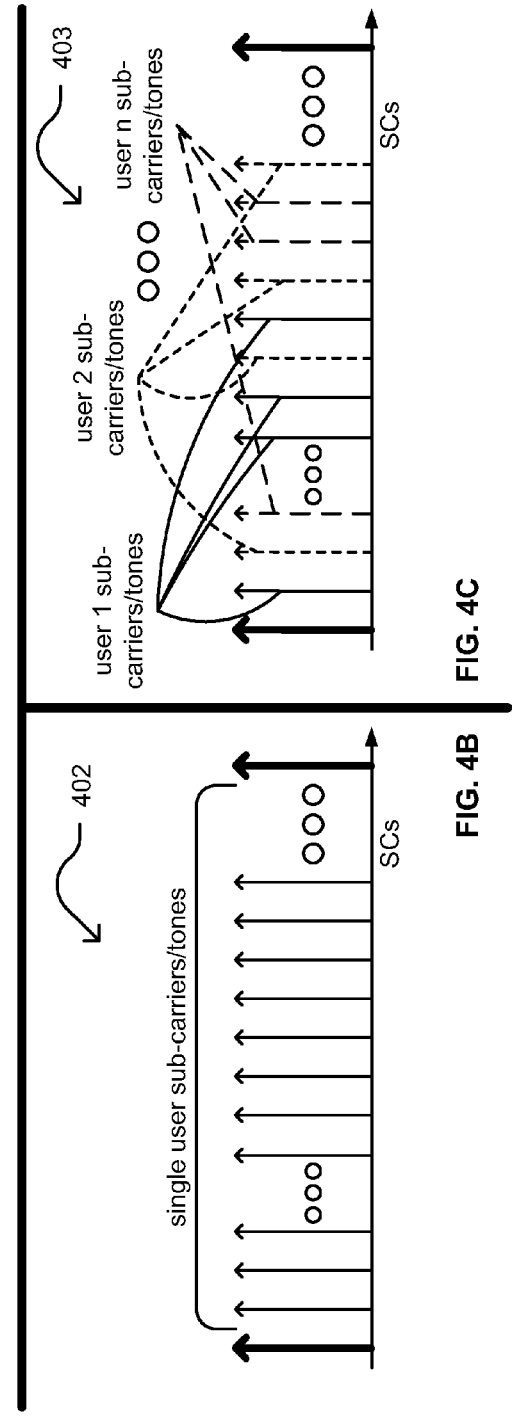
FIG. 4A
FIG. 4B
FIG. 4C

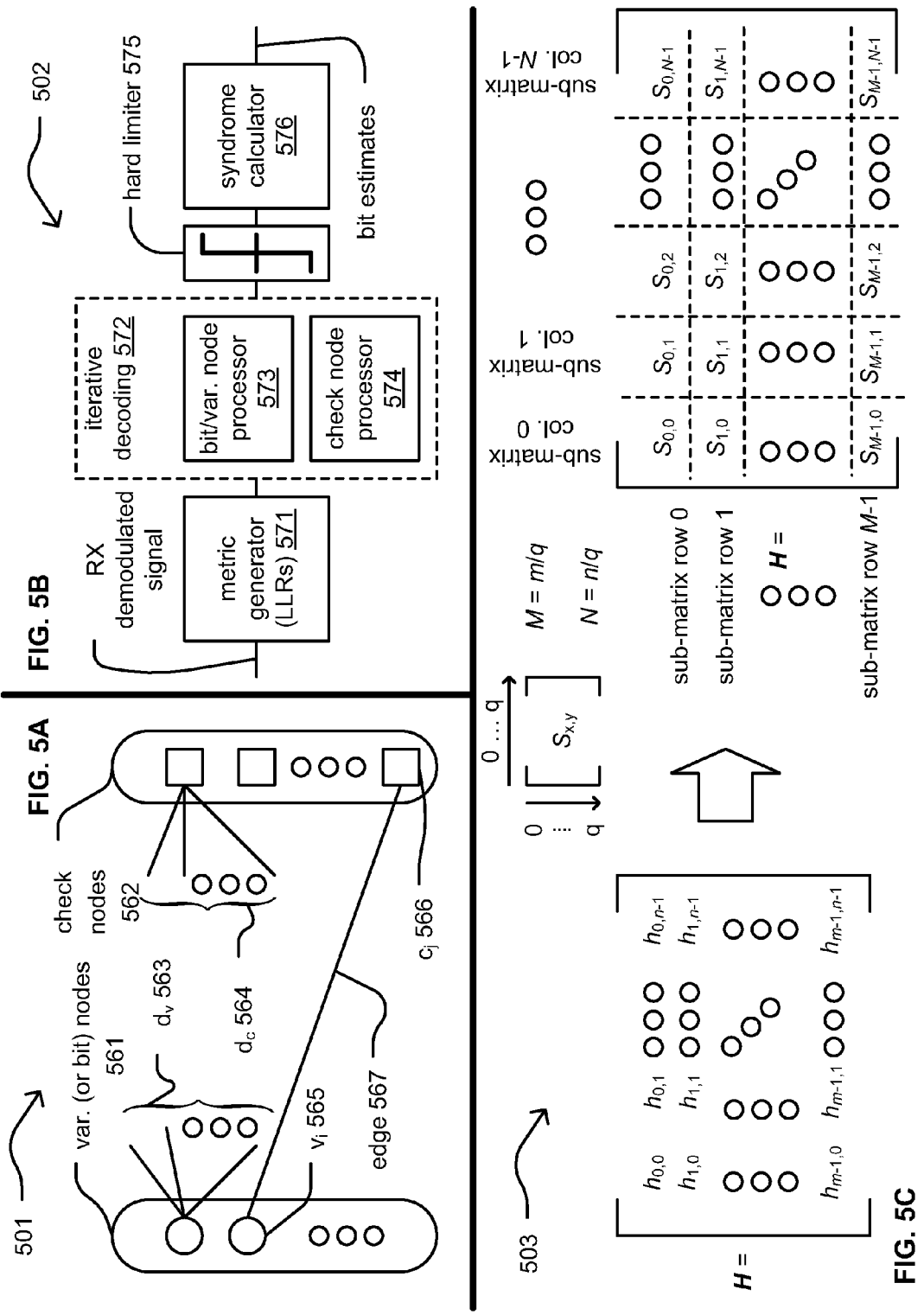

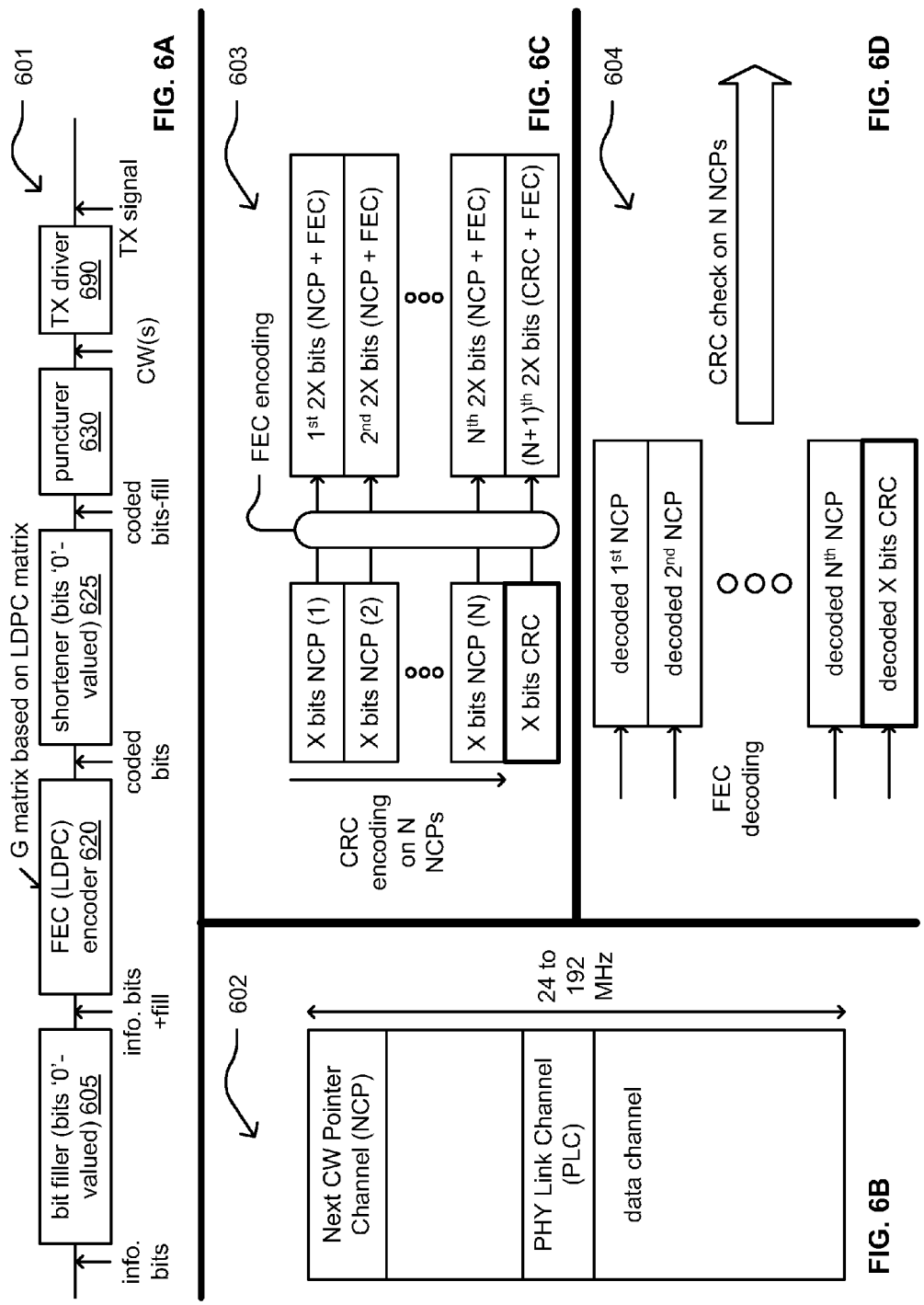

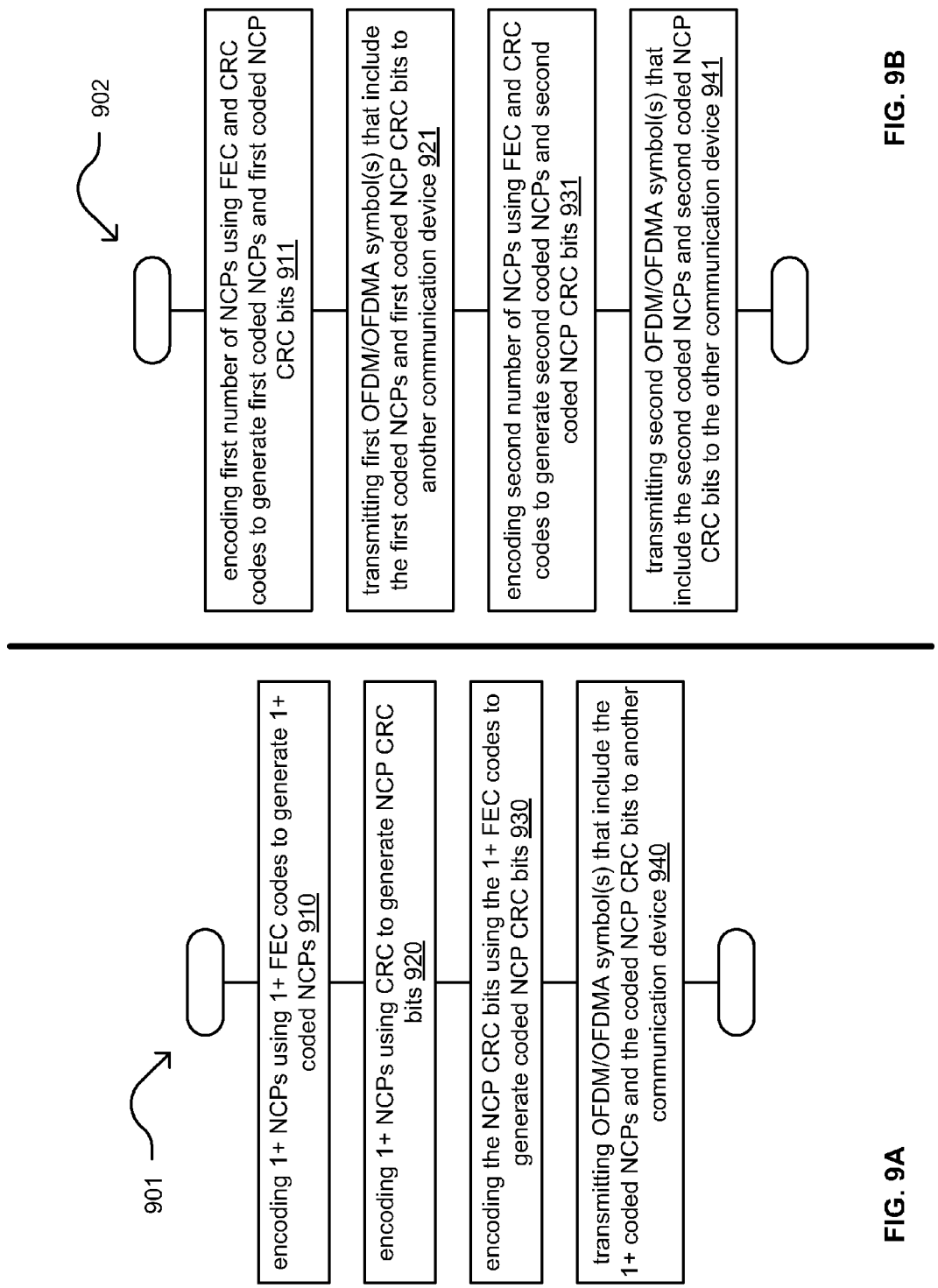

COMBINING CRC AND FEC ON A VARIABLE NUMBER OF NCPS

CROSS REFERENCE TO RELATED PATENTS/PATENT APPLICATIONS

The present U.S. Utility Patent App. claims priority pursuant to 35 U.S.C. §119(e) to U.S. Provisional App. No. 61/832,120, entitled "Combining CRC and FEC on a variable number of NCPs," filed Jun. 6, 2013, which is hereby incorporated herein by reference in its entirety and made part of the present U.S. Utility patent application for all purposes.

BACKGROUND

1. Technical Field

The present disclosure relates generally to communication systems; and, more particularly, to generation and transmission of forward error correction (FEC) coded and/or error correction code (ECC) coded signals within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error correction code (ECC) coding to increase the amount of information that may be transmitted between devices. When a signal incurs one or more errors during transmission, a receiver device can employ the FEC or ECC coding to try to correct those one or more errors.

A continual and primary directive in this area of development has been to try continually to lower the SNR required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the data rate per unit of bandwidth (i.e., spectral efficiency) to be used in a communication channel, having a particular signal to noise ratio (SNR), where transmission through the communication channel with arbitrarily low BER or SER is achievable.

Within the context of communication systems that employ one or more types of FEC or ECC coding, there continues to be much room for improvement related to better designed codes that provide for better performance (e.g., lower BER or SER for a given SNR). Also, a given application may operate more effectively with FEC or ECC coding particularly tailored for that application. One FEC or ECC code or a combination of multiple such codes may be more effective or efficient in one application as compared to another.

BRIEF DESCRIPTION OF THE SEVERAL VIEWS OF THE DRAWINGS

FIG. 3A is a diagram illustrating a communication device operative within one or more communication systems.

FIG. 3B is a diagram illustrating an example of operation of a communication device within one or more communication systems.

FIG. 3C is a diagram illustrating another example of operation of a communication device within one or more communication systems.

FIG. 4A is a diagram illustrating an example of orthogonal frequency division multiplexing (OFDM) and/or orthogonal frequency division multiple access (OFDMA).

FIG. 4B is a diagram illustrating another example of OFDM and/or OFDMA.

FIG. 4C is a diagram illustrating another example of OFDM and/or OFDMA.

FIG. 5A illustrates an example of an LDPC (Low Density Parity Check) code bipartite graph.

FIG. 5B illustrates an example of decoding of an LDPC coded signal.

FIG. 5C illustrates an example of an LDPC matrix that is partitioned into sub-matrices.

FIG. 6A is a diagram illustrating an example of a communication device configured to perform bit filling, LDPC encoding, shortening, and puncturing.

FIG. 6B is a diagram illustrating an example of an orthogonal frequency division multiplexing (OFDM) channel with physical layer (PHY) Link Channel (PLC).

FIG. 6C is a diagram illustrating an example of cyclic redundancy check (CRC) encoding combined with forward error correction (FEC) encoding.

FIG. 6D is a diagram illustrating an example of CRC check decoding after FEC decoding.

FIG. 9A is a diagram illustrating an embodiment of a method for execution by one or more communication devices.

FIG. 9B is a diagram illustrating another embodiment of a method for execution by one or more communication devices.

DETAILED DESCRIPTION

Figure 1:
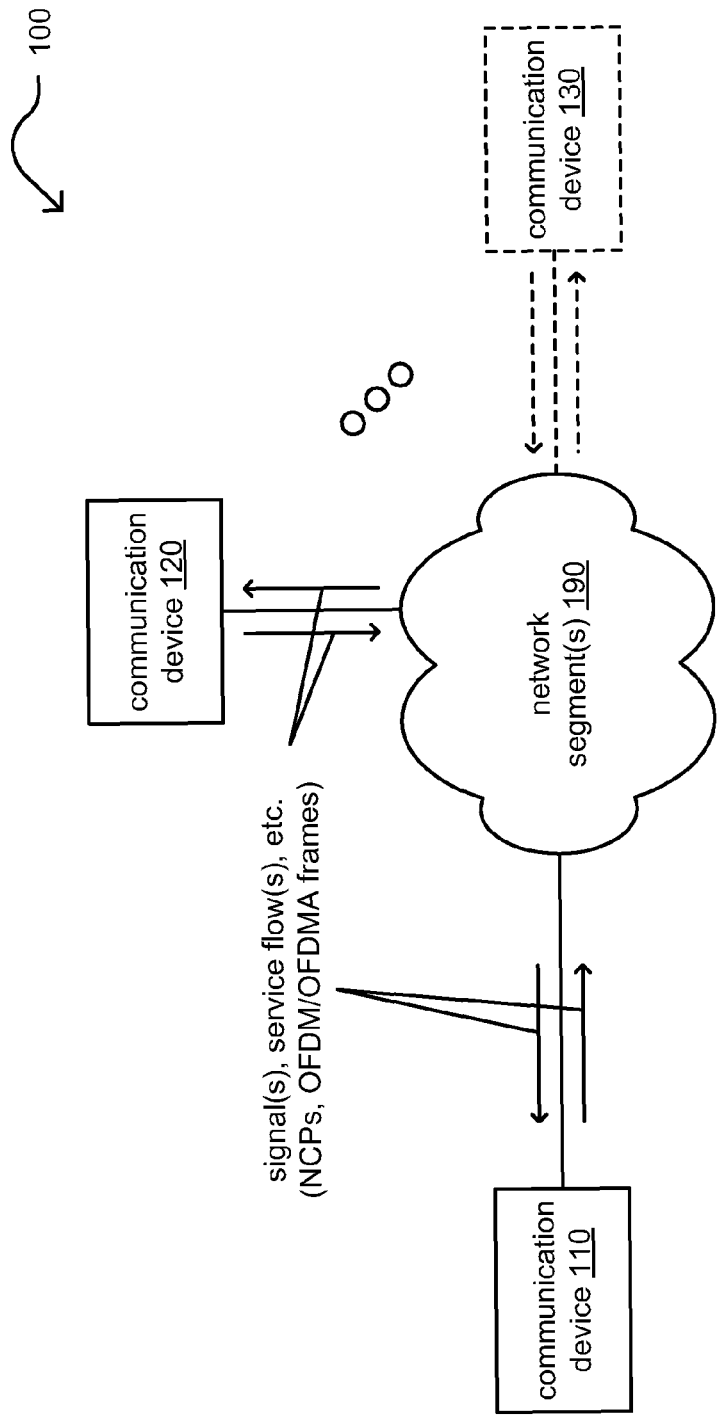
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120 (also referred to as CDs in certain locations in the diagrams). Note that general reference to a communication device may be made generally herein using the term 'device' (e.g., device 110 or CD 110 when referring to communication device 110, or devices 110 and 120, or CDs 110 and 120, when referring to communication devices 110 and 120). Generally speaking, any desired number of communication devices are included within one or more communication systems (e.g., as shown by communication device 130).

The various communication links within the one or more network segments 190 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 120-130. This communication may be bidirectional/to and from the one or more of the other devices 120-130 or unidirectional (or primarily unidirectional) from the one or more of the other devices 120-130. Device 110 also includes a processor configured to generate signals for transmission and interpret signals received from other devices. In exemplary operation, device 110's processor is configured to encode one or more next codeword pointers (NCPs) using a forward error correction (FEC) code to generate one or more coded NCPs. Any desired FEC and/or error correction code (ECC), or combination thereof, may be employed to generate the one or more coded NCPs. The processor then is configured to encode the one or more NCPs using a cyclic redundancy check (CRC) code to generate NCP CRC bits. The number of NCPs that undergo encoding using the FEC and CRC codes may be different at different times (e.g., generally, N NCPs, where N may vary between 1 and any desired positive integer number).

The processor then is configured to encode the NCP CRC bits using the FEC to generate coded NCP CRC bits. The processor is also configured to transmit one or more orthogonal frequency division multiplexing (OFDM) and/or orthogonal frequency division multiple access (OFDMA) symbols to another communication device via the communication interface. Generally speaking, note that when OFDM is referred to herein, OFDMA may be used in an alternative implementation, and vice versa. The one or more OFDM symbols include the one or more coded NCPs and the coded NCP CRC bits to indicate beginnings of one or more codewords within at least one of the one or more OFDM symbols and/or one or more additional OFDM symbols. These codewords may be included within the very same one or more OFDM symbols that include the one or more coded NCPs and the coded NCP CRC bits, or they may be included within subsequent OFDM symbols.

Figure 2:
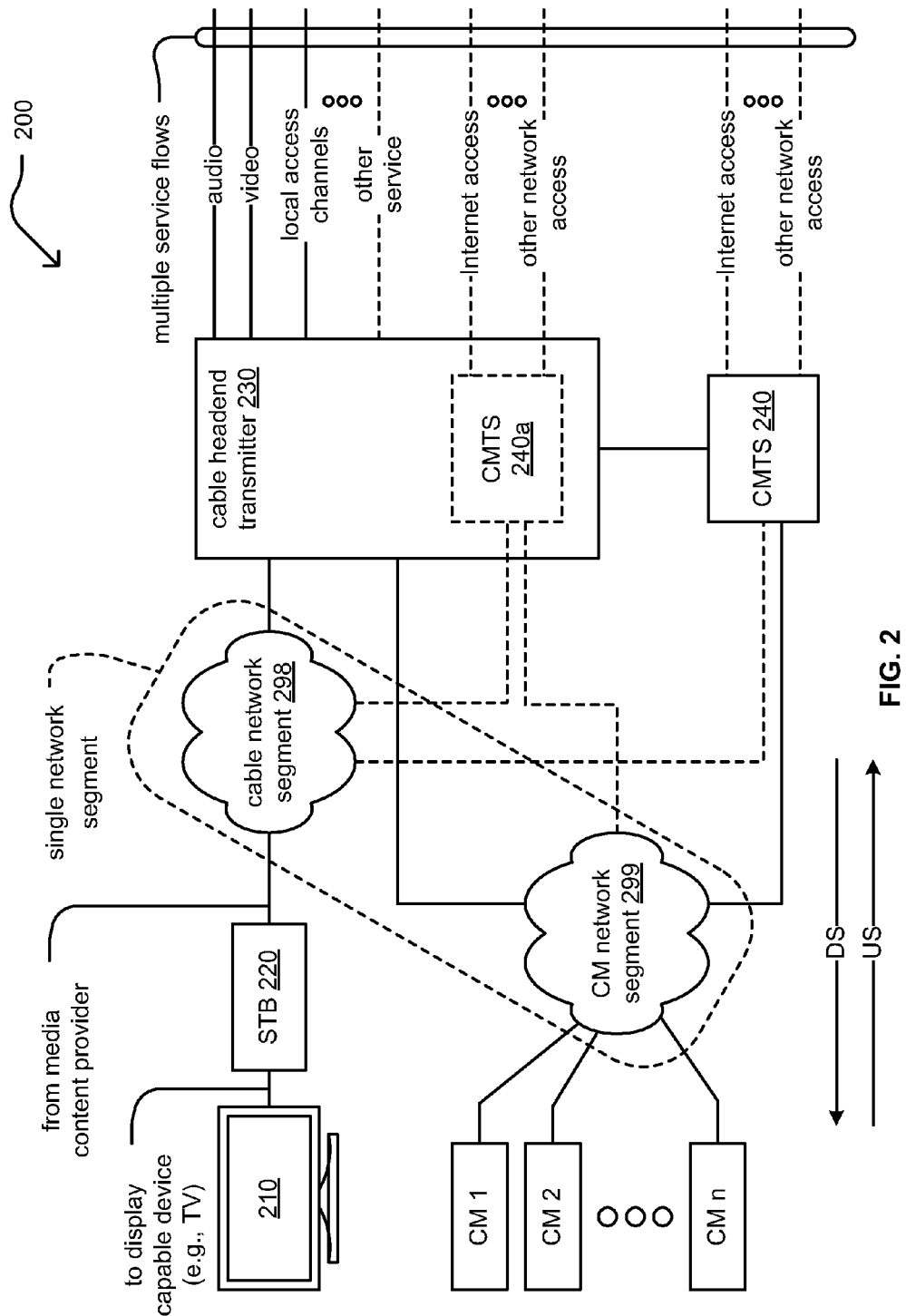
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240a. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240a). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 240 (or 240a) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM2, etc.), and upstream information is that which flows from the cable modems to the CMTS 240.

Any one of the devices in embodiment 200 (e.g., CMs 1-n, cable headend transmitter 230, CMTS 240a, and/or CMTS 240) may include functionality to generate and process signals for transmission to and received from other devices in embodiment 200. For example, any one of the devices in embodiment 200 may be configured to include a communication interface to support communications with any of the other devices and also include a processor to generate various orthogonal frequency division multiplexing (OFDM) and/or orthogonal frequency division multiple access (OFDMA) frames, packets, signals, etc. for transmission to any of the other devices and to process various such OFDM and/or OFDMA frames, packets, signals, etc. received from any of the other devices.

In exemplary operation of CM 1, CM 1's processor is configured to encode one or more NCPs using FEC code to generate one or more coded NCPs. The processor then is configured to encode the one or more NCPs using CRC code to generate NCP CRC bits. The number of NCPs that undergo encoding using the FEC and CRC codes may be different at different times (e.g., generally, N NCPs, where N may vary between 1 and any desired positive integer number). In one preferred implementation, the number of NCPs varies between 1 and 11 (e.g., as few as one NCP can undergo processing or any number up to and including 11 NCPs can undergo processing).

CM 1's processor then is configured to encode the NCP CRC bits using the FEC to generate coded NCP CRC bits. CM 1's processor is also configured to generate one or more OFDM and/or OFDMA symbols that include the one or more coded NCPs and the coded NCP CRC bits to indicate beginnings of one or more codewords within at least one of the one or more OFDM symbols and/or one or more additional OFDM symbols. CM 1's processor is also configured to transmit, via a communication interface of CM 1, the one or more OFDM and/or OFDMA symbols to another communication device. Note that the codewords indicated by the NCPs may be included within the very same one or more OFDM symbols that include the one or more coded NCPs and the coded NCP CRC bits, or they may be included within subsequent OFDM symbols.

FIG. 3A is a diagram 301 illustrating a communication device (CD) 110 operative within one or more communication systems. The device 110 includes a communication interface 320 and a processor 330. The communication interface 320 includes functionality of a transmitter 322 and a receiver 324 to support communications with one or more other devices within a communication system. The device 110 may also include memory 340 to store information including one or more signals generated by the device 110 or such information received from other devices (e.g., device 120) via one or more communication channels. Memory 340 may also include and store various operational instructions for use by the processor 330 in regards to the processing of messages and/or other received signals and generation of other messages and/or other signals including those described herein. The communication interface 320 is configured to support communications to and from one or more other devices (e.g., CD 120 and/or other communication devices). Operation of the communication interface 320 may be directed by the processor 330 such that processor 330 transmits and receives signals (TX(s) and RX(s)) via the communication interface 320.

In exemplary operation, processor 330 is configured to encode one or more next codeword pointers (NCPs) using a forward error correction (FEC) code to generate one or more coded NCPs. Processor 330 may be configured to perform forward error correction (FEC) coding and/or error correction code (ECC) coding of the NCPs to generate one or more coded NCPs. Examples of FEC code and/or ECCs may include turbo code, convolutional code, turbo trellis coded modulation (TTCM), low density parity check (LDPC) code, Reed-Solomon (RS) code, BCH (Bose and Ray-Chaudhuri, and Hocquenghem) code, cyclic redundancy check (CRC) coding, etc. Processor 330 is also configured to encode the one or more NCPs using a cyclic redundancy check (CRC) code to generate NCP CRC bits. Processor 330 is also configured to encode the NCP CRC bits using the FEC to generate coded NCP CRC bits. Processor 330 then is configured to generate one or more OFDM symbols that include the one or more coded NCPs and the coded NCP CRC bits to indicate beginnings of one or more codewords within at least one of the one or more OFDM symbols and/or one or more additional OFDM symbols. Processor 330 then is configured to transmit one or more OFDM symbols to another communication device via the communication interface 320.

FIG. 3B is a diagram illustrating an example 302 of operation of a communication device within one or more communication systems. Device 110 is configured to support communications to and from one or more other devices, such as device 120. Device 120 is configured to generate one or more signals with one or more NCP indicated codewords. Device 120 is also configured to generate one or more NCPs that indicate those one or more NCP indicated codewords. In this example 302, device 120 transmits the one or more NCPs separately from the one or more signals with one or more NCP indicated codewords. That is, the NCPs are transmitted in separate transmissions as the one or more signals with one or more NCP indicated codewords.

FIG. 3C is a diagram illustrating another example 303 of operation of a communication device within one or more communication systems. This diagram shows communications being made at different times between devices 110 and 120. At or during a first time (time 1), device 110 is configured to generate one or more NCPs that indicate one or more NCP indicated codewords as well as those one or more codewords that are indicated by the one or more NCPs. In this example 303, device 110 transmits the one or more NCPs along with the one or more NCP indicated codewords. Device 110 may be configured to transmit this combined information in one or more OFDM or OFDMA symbols (which may be arranged in one or more OFDM or OFDMA packets, frames, etc.).

At or during a second time (time 2), device 110 is configured to generate other/$2^{nd}$ one or more NCPs that indicate other/$2^{nd}$ one or more NCP indicated codewords as well as those other/$2^{nd}$ one or more codewords that are indicated by the other/$2^{nd}$ one or more NCPs. In this example 303, device 110 transmits the other/$2^{nd}$ one or more NCPs along with the other/$2^{nd}$ one or more NCP indicated codewords. Also, device 110 may be configured to transmit this combined information in one or more OFDM or OFDMA symbols (which may be arranged in one or more OFDM or OFDMA packets, frames, etc.).

FIG. 4A is a diagram illustrating an example 401 of orthogonal frequency division multiplexing (OFDM) and/or orthogonal frequency division multiple access (OFDMA). OFDM's modulation may be viewed as dividing up an available spectrum into a plurality of narrowband sub-carriers (SCs in the diagram) (e.g., relatively lower data rate carriers). The sub-carriers are included within an available frequency spectrum portion or band. This available frequency spectrum is divided into the sub-carriers or tones used for the OFDM or OFDMA symbols and frames. Typically, the frequency responses of these sub-carriers are non-overlapping and orthogonal. Each sub-carrier may be modulated using any of a variety of modulation coding techniques (e.g., as shown by the vertical axis of modulated data).

A communication device may be configured to perform encoding of one or more bits to generate one or more coded bits used to generate the modulation data (or generally, data). For example, a processor of a communication device may be configured to perform forward error correction (FEC) coding and/or error correction code (ECC) coding of one or more bits to generate one or more coded bits. Examples of FEC code and/or ECCs may include turbo code, convolutional code, turbo trellis coded modulation (TTCM), low density parity check (LDPC) code, Reed-Solomon (RS) code, BCH (Bose and Ray-Chaudhuri, and Hocquenghem) code, cyclic redundancy check (CRC) coding, etc. The one or more coded bits (and/or uncoded bits) then undergo modulation or symbol mapping to generate modulation symbols. The modulation symbols include data intended for one or more recipient devices. Note that such modulation symbols may be generated using any of various types of modulation coding techniques. Examples of such modulation coding techniques include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, 2048 QAM, etc.).

FIG. 4B is a diagram illustrating another example 402 of OFDM and/or OFDMA. A transmitting device transmits modulation symbols via the sub-carriers. OFDM and/or OFDMA modulation may operate by performing simultaneous transmission of a large number of narrowband carriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a CP (Cyclic Prefix) and/or cyclic suffix (CS) (shown in right hand side of FIG. 4A) that may be a copy of the CP may also be employed within the guard interval to allow switching time, such as when jumping to a new communication channel or sub-channel, and to help maintain orthogonality of the OFDM and/or OFDMA symbols. Generally speaking, an OFDM and/or OFDMA system design is based on the expected delay spread within the communication system (e.g., the expected delay spread of the communication channel).

In a single-user system in which one or more OFDM symbols or OFDM frames are transmitted between a transmitter device and a receiver device, all of the sub-carriers or tones are dedicated for use in transmitting modulated data between the transmitter and receiver devices. In a multiple user system in which one or more OFDM symbols or OFDM frames are transmitted between a transmitter device and multiple recipient or receiver devices, the various sub-carriers or tones may be mapped to different respective receiver devices as described below with respect to FIG. 4C.

FIG. 4C is a diagram illustrating another example 403 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of subcarriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first frame, a second assignment for second frame, etc.). Note that the assignment of different sub-carriers to different users may include adjacently located sub-carriers for each user, intermingled sub-carriers for each user, and/or any combination of adjacently located or intermingled sub-carrier assignment. An OFDM frame may include more than one OFDM symbol. Similarly, an OFDMA frame may include more than one OFDMA symbol. In addition, such sub-carrier/tone assignment may be dynamic among different respective symbols within a given frame or superframe (e.g., a first assignment for a first OFDMA symbol within a frame, a second assignment for a second OFDMA symbol within the frame, etc.). Generally speaking, an OFDMA symbol is a particular type of OFDM symbol, and general reference to OFDM symbol herein includes both OFDM and OFDMA symbols (and general reference to OFDM frame herein includes both OFDM and OFDMA frames).

Generally, a communication device may be configured to include a processor configured to process received OFDM or OFDMA symbols and/or frames and to generate such OFDM or OFDMA symbols and/or frames. The processor of the communication device is configured to perform encoding using an FEC code to generate next codeword pointers (NCPs) to indicate beginning of codewords (e.g., that may themselves be generated by one or more ECCs and/or FEC codes) within the same signal (e.g., OFDM or OFDMA frame) or one or more other signals (e.g., OFDM and/or OFDMA frames).

A processor within a communication device (e.g., communication device 110) may be configured to generate various OFDM and/or OFDMA frames, packets, signals, etc. for transmission to any of the other devices and to process various such OFDM and/or OFDMA frames, packets, signals, etc. received from any of the other devices. Such OFDM and/or OFDMA frames, packets, signals, etc. may include the one or more coded NCPs and the coded NCP CRC bits to indicate beginnings of one or more codewords within at least one of the one or more OFDM symbols and/or one or more additional OFDM symbols. These codewords may be included within the very same one or more OFDM symbols that include the one or more coded NCPs and the coded NCP CRC bits, or they may be included within subsequent OFDM symbols.

FIG. 5A illustrates an example 501 of an LDPC (Low Density Parity Check) code bipartite graph. An LDPC bipartite graph is sometimes referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T = 0, \forall x \in C \qquad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r = (n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph by its parity check matrix with left side nodes representing variable of the code bits (or alternatively as the "variable nodes" (or "bit nodes") 561 in a bit-based decoding of LDPC coded signals), and the right side nodes representing check equations (or alternatively as the "check nodes" 562). The bipartite graph (or Tanner graph) of the LDPC code defined by H may be defined by N variable nodes (e.g., N bit nodes) and M check nodes. Every variable node of the N variable nodes 561 has exactly $d_v(i)$ edges. As an example, edge 567 connects the bit node, $v_i$ 565, to one or more of the check nodes (within the M check nodes). The edge 567 is specifically shown as connecting from the bit node, $v_i$ 565, to the check node, $c_j$ 566. This number of edges (shown as 563) may be referred to as the degree of a variable node i. Analogously, a check node of the M check nodes 562 has $d_c(j)$ edges (shown as $d_c$ 564) connecting this node to one or more of the variable nodes (or bit nodes) 561. This number of edges, $d_c$ 564, may be referred to as the degree of the check node j.

An edge 567 between a variable node $v_i$ (or bit node $b_i$) 565 and check node $c_j$ 566 can be defined by e=(i,j). Alternatively, given an edge e=(i,j), the nodes of the edge may alternatively be denoted as by e=(v(e),c(e)) (or e=(b(e),c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 5B illustrates an example 502 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 571 calculates log-likelihood ratios (LLRs) for each bit location within the received bit sequence. These LLRs correspond initially to the bit nodes 561 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 572). Check node processing or check node updating is performed using the original bit edge messages (e.g., the calculated LLRs) such as by a check node processor 574. A bit/variable node processor 573 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 574 performs check message updating (based on rows of the LDPC matrix) to generate updated check edge messages, and the bit/variable node processor 573 performs bit or variable edge message updating (based on columns of the LDPC matrix) as also described with reference to FIG. 5A.

When more than one decoding iteration is performed, these variable node edge messages are then used by the check node processor 574 for subsequent check node processing or check node updating to calculate updated check edge messages. Then, bit/variable node processor 573 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 576), the last calculated variable node soft information may undergo hard limiting (e.g., in a slicer or hard limiter 575) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. Device 110 may be implemented to perform encoding and/or decoding of LDPC coded signal using any desired approach or architecture.

Note that the various functional blocks and components depicted in FIG. 5B may be implemented or performed by the processor 330 (and memory 340) of communication device 110. For example, the processor 330 can be implemented to perform such decoding operations and the memory 340 can be implemented to store and perform memory management for the various bit/variable and check edge messages, variable bit/node soft information, extrinsic information, etc. used in the decoding operations.

FIG. 5C illustrates an example 503 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with an LDPC matrix, H: $GH^T=0$. An LDPC code may be defined or characterized by its LDPC matrix, H, and/or its generator matrix, G.

A processor of a communication device (e.g., processor 330 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 320 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j \pmod{q} \\ 0 & \text{otherwise} \end{cases}$$

for any i and j, with 0≤i<q and 0≤j<q. For example, the q-by-q identity matrix is itself a CSI matrix with a shift-value $\lambda(S)=0$ (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u 3. The base matrix $H_b$ is expanded by replacing each sub-matrix in the base matrix with a size z permutation matrix, and each 0 with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size p(i,j)≥0 (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

A communication device may be configured to perform FEC encoding using an LDPC code. One possible implementation of LDPC coding is described below. Other approaches of LDPC encoding may be performed in alternative embodiments. Processor 330 of a communication device encodes input (information) bits and computes L·m parity bits, $c_{par}$ (e.g., LDPC coded bits) as follows: $c_{par}=(c_k, c_{k+1}, \ldots, c_{Ln-1})$ The processor 330 then outputs the following:

$$c_P^T = \begin{pmatrix} C_0 \\ C_1 \\ C_2 \\ C_3 \\ C_4 \end{pmatrix}, \text{ where } C_i = (c_{L(n-m+i)}, c_{L(n-m+i)+1}, \ldots, c_{L(n-m+i)+L-1})^T.$$

The encoding procedure may be described as follows:
Input: $c_I=(c_0, c_1, \ldots, c_{k-1})$
Step 1: compute $V_i = H_{I,i} c_I^T$, such that i=0, ..., 4.
Step 2: back-substitution $C_0 = V_0(L - u_{0,0})$ $C_1 = V_1(L - u_{1,1}) + C_0((L - u_{1,1} + u_{1,0}) \bmod L)$ $C_2 = V_2(L - u_{2,2}) + C_1((L - u_{2,2} + u_{2,1}) \bmod L)$ $C_3 = V_3(L - u_{3,3}) + C_2((L - u_{3,3} + u_{3,2}) \bmod L)$ $C_4 = V_4(L - u_{4,4}) + C_3((L - u_{4,4} + u_{4,3}) \bmod L)$ Output:

$$c_P^T = \begin{pmatrix} C_0 \\ C_1 \\ C_2 \\ C_3 \\ C_4 \end{pmatrix}$$

FIG. 6A is a diagram illustrating an example 601 of a communication device configured to perform bit filling, LDPC encoding, shortening, and puncturing. A bit filler 605 operates to add one or more zero-valued bits to incoming information bits before encoding by forward error correction (FEC) encoder 620. The FEC encoder 620 processes information bits to generate coded bits. In the context of LDPC encoding, encoder 620 employs a generator matrix that is based on a given LDPC code that may also be characterized by a corresponding LDPC matrix. The LDPC matrix can have the characteristics and forms such as described with reference to FIG. 5B such that all sub-matrices of the LDPC matrix are all-zero-valued sub-matrices with the exception of those sub-matrices on the main diagonal and the other diagonal adjacently located that are CSI sub-matrices.

After FEC encoding, a shortener 625 removes those zero-valued bits that were added to the information bits before undergoing FEC encoding. Puncturer 630 punctures one or more subsets of coded bits and/or parity bits from the coded bits generated by the FEC encoder 620 and that have undergone shortening within shortener 625 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and two subsets of bits punctured from the parity bits). Such puncturing may be performed using different periods of bits, and/or different starting locations within the coded bits.

Transmit (TX) driver 690 processes the one or more codewords to generate one or more continuous-time signals for transmission to one or more other devices via one or more communication channels. The TX driver 690 may perform operations such as those of an analog front end (AFE) of a communication device (e.g., digital to analog conversion, filtering, frequency conversion (up or down), gain adjustment and/or scaling, etc.). Generally, the TX driver 690 operates to generate a signal suitable for transmission from the communication device. Note that the operations of the various functional blocks, components, etc. within FIG. 6A may be performed within communication device 110. For example, communication interface 320 may be configured to perform the operations of transmit (TX) driver 690. The processor 330 may be configured to perform bit filling, LDPC encoding, shortening, puncturing, and/or other related operations.

FIG. 6B is a diagram illustrating an example 602 of an orthogonal frequency division multiplexing (OFDM) channel with physical layer (PHY) Link Channel (PLC). The PHY Link Channel (PLC) relative to the OFDM channel is shown in this diagram. The PHY Link Channel (PLC) is located in the downstream convergence layer. It may be used for several tasks including the following:

1. Timestamp.
2. Energy management.
3. Message channel for bringing new cable modems (CMs) on line.
4. Trigger message for synchronizing an event between the CMTS and CM.

The CMTS may be configured to assign a unique PLC to each OFDM channel. If there is more than one OFDM channel, the CM will be directed as to which PLC will be the primary PLC for the CM. When the CM initializes, it first locates a PLC channel. It then acquires just enough configuration information to join a primary downstream profile in the main OFDM channel. From there, it receives further configuration information. Certain preferred radio frequency (RF) parameters and CRC-24-D may be employed (as based on FIG. 6B below).

The Next Codeword Pointer (NCP) channel is used and added to downstream OFDM symbols to point to the codewords being transmitted (e.g., one pointer per codeword). The NCPs and data subcarriers may be time interleaved together, and one OFDM symbol may incorporate more than one NCP (e.g., several NCPs). The NCP structure can be based on a rate 1/2 (48, 24) LDPC code that includes 24 information bits plus 24 parity bits. A successful decoding of an FEC codeword relies on a proper reception and decoding of its associated NCP. As such, the NCP FEC is designed to provide good immunity against noise (additive white Gaussian noise (AWGN) and burst noise) and should generally have error correction capability at least as good as the FEC used for the data channel. One possible LDPC code suitable for the NCP channel is a punctured LDPC code 50% (48,24) that is structured from a short LDPC code (160,80) as shown with reference to FIG. 8A below. A constellation size of 64 quadrature amplitude modulation (QAM) may be used such that each NCP requires 48 coded bits with 8 tones or sub-carriers.

FIG. 6C is a diagram illustrating an example 603 of cyclic redundancy check (CRC) encoding combined with forward error correction (FEC) encoding. The number of Next Codeword Pointer (NCP) ranges, N, ranges from 1 to 11. A 24 bit CRC is employed (e.g., N×24 information bits) and 24 parity bits. One possible FEC code employed is a rate 1/2 (48, 24) LDPC code (e.g., X in the diagram is equal 24). In other implementations, other FEC codes may alternatively be used or in combination with such an LDPC code.

In exemplary operation, this example 603 can operate for the Next Codeword Pointer (NCP) channel. However, note that similar CRC coding combined with FEC encoding may be performed for other channels. Information bits are partitioned into groups of X bits each to be encoded and transmitted via the NCP channel (e.g., X=24 using a rate 1/2 (48, 24) LDPC code). CRC encoding is performed on a number of these groups of X bits (e.g., consider N groups of X bits to generate a CRC block (e.g., X bits CRC, such as including 24 bits using a 24 bit CRC).

CRC encoding is performed on each of the respective NCPs to generate coded NCP CRC bits. In one example, each of the respective NCPs includes 24 bits, and the CRC block includes 24 bits. Other examples may include NCPs with different numbers of bits as well as different numbers of bits within each one of the coded NCP CRC bits. Also, each NCP undergoes forward error correction (FEC) encoding to generate a respective coded NCP. When a rate one-half code is employed, such as the (48, 24) LDPC code, then 48 bits are generated based on 24 input bits (e.g., NCP of 24 bits) such that 24 redundancy bits are also generated (e.g., in a systematic code implementation). Each of these respective bits would then include 48 bits composed of the individual respective NCP plus the FEC redundancy bits generated based on the NCP. Also, the NCP CRC bits (e.g., CRC block shown with bold face line at bottom of column) undergoes FEC encoding as well to generate coded NCP CRC bits that include CRC plus FEC generated redundancy bits based on the NCP CRC bits.

In all, including the CRC block, there are then N+1 blocks that undergo FEC encoding to generate coded blocks (e.g., composed of one or more coded NCPs and coded NCP CRC bits). For example, the first block of X bits undergo FEC encoding to generate a first coded block (1$^{st}$ 2X bits (NCP+FEC)), a second block of X bits undergo FEC encoding to generate a second coded block (2$^{nd}$ 2X bits (NCP+FEC)), and so on up to the CRC block undergoing FEC encoding to generate a last/N+1$^{th}$ coded block (2X bits (CRC+FEC)). These various coded blocks then undergo appropriate processing to generate one or more signals (e.g., OFDM and/or OFDMA symbols, which may be arranged in frames, packets, etc.) for transmission to another communication device via a communication channel (e.g., the NCP channel).

FIG. 6D is a diagram illustrating an example 604 of CRC check decoding after FEC decoding. The various coded blocks initially undergo FEC decoding to generate decoded groups of X bits (e.g., 1$^{st}$ NCP, 2$^{nd}$ NCP, etc.) corresponding to the various groups of X bits shown above and FIG. 6B and the CRC block. After this is complete, a CRC check is performed on all of the N NCPs as well.

The combination of CRC and FEC encoding/decoding may be viewed as being performed in two dimensions such that a CRC block is first generated based on the multiple groups of X bits in a first direction (e.g., vertically in the diagram), and then FEC encoding is performed on the multiple groups of X bits as well as the CRC block in a second direction (e.g., horizontally in the diagram).

In many applications, LDPC codes typically have sizes of beyond 100 bit block lengths. This disclosure presents various ways to perform puncturing or bit filling, shortening, and puncturing in combination with LDPC coding to generate relatively short length codes (e.g., much shorter than 100, and a shortest of 24 bits in at least one instance). Such operations may be performed using the example 601 of FIG. 6A.

To describe a shortening pattern, three indices are used, as follows:

(1) Shortening period
(2) Shortening sizes
(3) Shortening start position for a period Consider the constructed short LDPC code is an (N, K) code, then there are N positions, namely 0, 1, . . . , N−1. Consider that k information bits will be encoded. A shortening pattern with P periods may denote a shortening size for every period by $s_0, s_1, \ldots, s_{P-1}$, respectively, and the shortening start positions for every period by $n_0, n_1, \ldots, n_{P-1}$. This may be described as follows:

$$\sum_{i=0}^{P-1} s_i = K - k \text{ and } 0 \leq n_0 < n_1 < \ldots < n_{P-1} < K - 1.$$

An LDPC encoder can be implemented as follows:

Given k information data bits, after the first $n_0$ information bits pad $s_0$ the receiver known bits, say 0s; then fill more information bits before the position $n_1$; then pad $s_1$ 0's starting at position $n_2$, . . . etc.

LDPC encoding will then generate a codeword as follows:

$(c_0, c_1, \ldots, c_{K-1}, c_K, \ldots, c_{N-1})$.

Among the k information bits there are K−k padded or filled 0-valued bits (e.g., bits having value of '0'/zero). The last N−K codeword bits are parity bits, namely, $c_0 c_K, \ldots, c_{N-1}$.

Similar to the shortening pattern, the puncturing pattern also uses 3 sets of indices as follows:

(1) Puncturing period, say Q
(2) Puncturing sizes, say $t_0, t_1, \ldots, t_{Q-1}$
(3) Puncturing start position, say $m_0, m_1, \ldots, m_{Q-1}$ The output bits of the shortening and puncturing encoder can be given as follows:

Step 1: from the codeword $(c_0, c_1, \ldots, c_{K-1}, c_K, \ldots, c_{N-1})$, starting from position $m_i$ delete $t_i$ bits, respectively, for i=0, . . . , Q−1.

Step 2: delete all filled or padded bits from LDPC encoder.

Figures 7A, 7B:
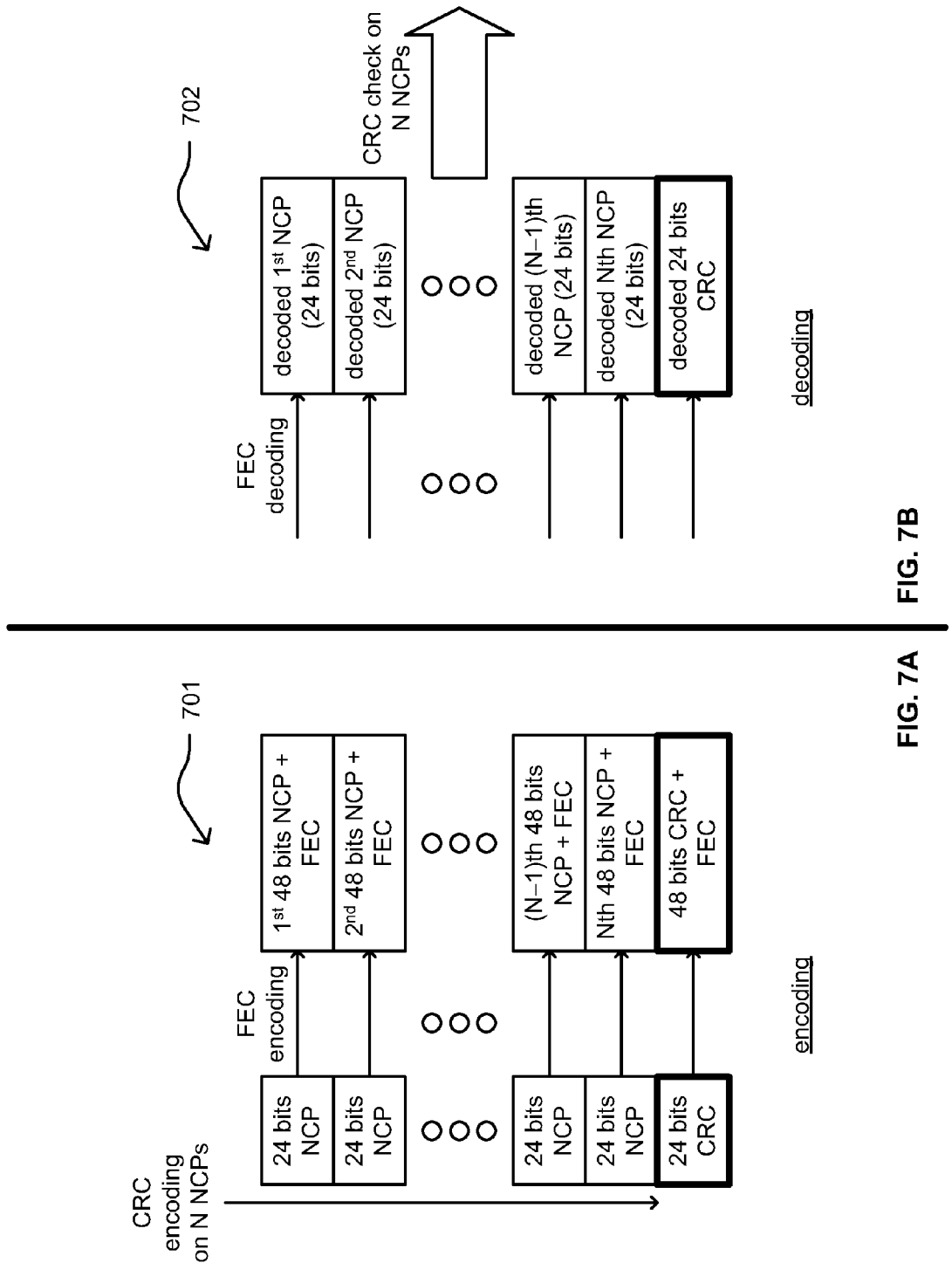
FIG. 7A is a diagram illustrating an example of encoding using a variable number of next codeword pointers (NCPs) with cyclic redundancy check (CRC) added.
FIG. 7B is a diagram illustrating an example of decoding using a variable number of NCPs with CRC added.

FIG. 7A is a diagram illustrating an example 701 of encoding using a variable number of next codeword pointers (NCPs) with cyclic redundancy check (CRC) added. This example shows a specific example of a variable number of NCPs of 24 bits each undergo encoding (e.g., in a processor of a communication device) based on a FEC code (e.g., a rate 1/2 LDPC coded) to generate one or more coded NCPs of 48 bits each. A processor of a communication device may be configured to encode individually each NCP of 24 bits to generate 48 bits horizontally as shown in the diagram. The number of NCPs can range between 1 to 11, inclusive (e.g., 4 NCPs may be processed at or during time 1, then 8 NCPs may be processed at or during time 2, then 11 NCPs may be processed at or during time 3, and so on). The processor of the communication device may be configured to encode the one or more NCPs using a cyclic redundancy check (CRC) code (e.g., that generates 24 CRC redundancy bits based on variable number of inputs) to generate NCP CRC bits. The processor of the communication device may be configured to encode the NCP CRC bits using the FEC code to generate coded NCP CRC bits code (e.g., that generates 24 CRC redundancy bits based on the 24 NCP CRC bits). The processor of the communication device may then be configured to generate one or more OFDM symbols that include the one or more coded NCPs and the coded NCP CRC bits to indicate beginnings of one or more codewords within at least one of the one or more OFDM symbols and/or one or more additional OFDM symbols. The processor of the communication device may then be configured to transmit the one or more OFDM symbols to another communication device via a communication interface of the communication device.

In an example where as few as 1 or as many as 11 NCPs undergo processing, the variability of encoding different numbers of NCPs indicates that as few as 96 NCP related bits may be included within the one or more OFDM symbols when only 1 NCP undergoes processing (e.g., 1 NCPs+the NCP CRC bits generated therefrom each undergoing FEC encoding using a rate 1/2 LDPC code) and as many as 576 NCP related bits may be included within the one or more OFDM symbols when up to 11 NCP undergoes processing (e.g., 11 NCPs+the NCP CRC bits generated therefrom each undergoing FEC encoding using a rate 1/2 LDPC code). The use of variability in encoding different numbers of NCPs allows for better use of bandwidth of one or more available communication channels such that a fixed number of bits are not specifically dedicated for certain communications whether or not all of those bits are needed.

FIG. 7B is a diagram illustrating an example 702 of decoding using a variable number of NCPs with CRC added. This example 702 may be understood with reference to example 701 of FIG. 7A. The various coded blocks initially undergo FEC decoding to generate decoded groups of 24 bits (e.g., decode 1$^{st}$ NCP of 24 bits, decode 2$^{nd}$ NCP of 24 bits, etc.) corresponding to the various groups NCPs of 24 bits each shown above with reference to FIG. 7A. After this is complete, a CRC check is performed on all of the N NCPs as well.

Figure 8:
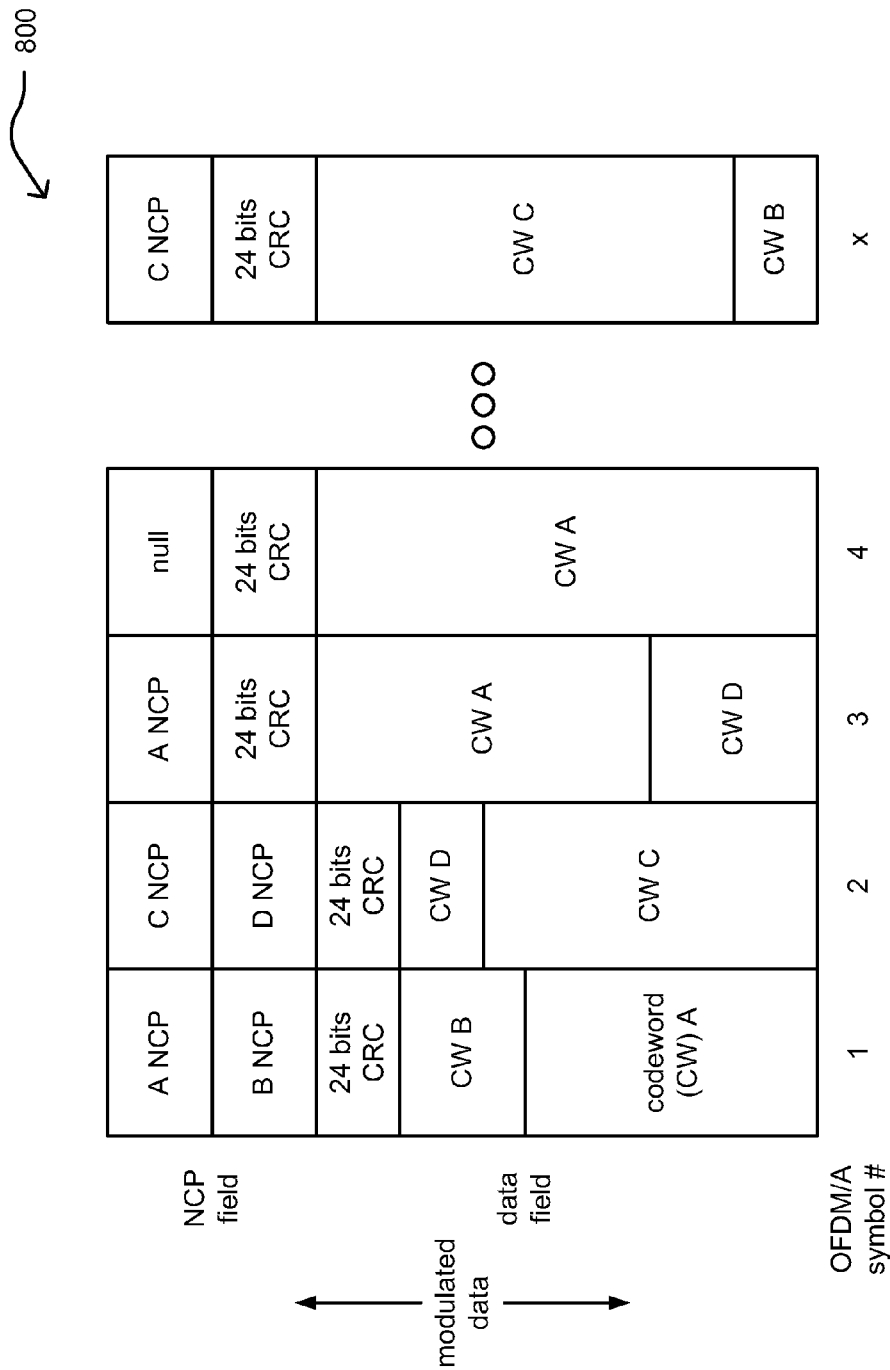
FIG. 8 is a diagram illustrating an example of OFDM or OFDMA symbols that include Next Codeword Pointer (NCP) message blocks.

FIG. 8 is a diagram illustrating an example 800 of OFDM or OFDMA symbols that include Next Codeword Pointer (NCP) message blocks. In this diagram, a number of OFDM or OFDMA symbols include NCP message blocks (e.g., shown as A NCP, B NCP, etc.) as well as various codewords (e.g., codeword (CW) A, CW B, CW C, etc.). The OFDM or OFDMA symbols (x shown in this diagram) may be arranged in an OFDM or OFDMA frame, packet, etc. The one or more coded NCPs and the coded NCP CRC bits are mapped to sub-carriers according to a preferred ordering (e.g., starting with a top of the frequency spectrum of allocated sub-carriers and then down to lower frequency sub-carriers). In this example 800, CW A starts at the beginning of the OFDM/OFDMA symbol 1 and has a NCP start pointer (e.g., A NCP). CW B starts after CW A also has a respective NCP start pointer (e.g., B NCP). Note that the length/size of the CW B is different than CW A. The length of CW A is the difference between the A NCP for CW A and the B NCP for CW B.

Also, in this example 800, CW C starts at the beginning of the OFDM/OFDMA symbol 2 and has a NCP start pointer (e.g., C NCP). The length of the previous CW B is determined based on the difference between the B NCP for CW B and C NCP for CW C. D NCP for CODEWORD D also starts in OFDM/OFDMA symbol 2.

In OFDM/OFDMA symbol 3, CW D continues from OFDM/OFDMA symbol 2 and finishes. CW A follows and is given a start pointer A NCP for CW A. The length of CW D is determined based on the difference between the NCP for C NCP for CW C and the D NCP for CW D. Additional arrangement of OFDM/OFDMA symbols may be understood similarly based on the arrangement of OFDM/OFDMA symbols 1-3. Note that FIG. 8 shows just one possible arrangement of OFDM/OFDMA symbols that include coded NCPs and coded NCP CRC bits. A receiver communication device processes such OFDM/OFDMA symbols to extract such NCP related information to identify the location of the beginnings of the codewords within the same OFDM/OFDMA symbols or subsequent OFDM/OFDMA symbols.

FIG. 9A is a diagram illustrating an embodiment of a method 901 for execution by one or more wireless communication devices. The method 901 begins by encoding one or more next codeword pointers (NCPs) using a forward error correction (FEC) code to generate one or more coded NCPs (block 910). The method 901 continues by encoding the one or more NCPs using a cyclic redundancy check (CRC) code to generate NCP CRC bits (block 920).

The method 901 then operates by encoding the NCP CRC bits using the FEC to generate coded NCP CRC bits (block 930). The method 901 continues by transmitting one or more orthogonal frequency division multiplexing (OFDM) symbols to another communication device via a communication interface of the communication device (block 940). The one or more OFDM symbols include the one or more coded NCPs and the coded NCP CRC bits to indicate beginnings of one or more codewords within one or both of the one of the one or more OFDM symbols and one or more additional OFDM symbols.

FIG. 9B is a diagram illustrating another embodiment of a method 902 for execution by one or more wireless communication devices. The method 902 begins by encoding a first number of NCPs using an FEC code and CRC code to generate first coded NCPs and first coded NCP CRC bits (block 911). The method 902 continues by transmitting first one or more OFDM symbols to another communication device via a communication interface of the communication device (block 921). The first one or more OFDM symbols include the first coded NCPs and the first coded NCP CRC bits to indicate beginnings of first one or more codewords within one or both of the first one or more OFDM symbols and first one or more additional OFDM symbols.

The method 902 begins by encoding a second number of NCPs using an FEC code and CRC code to generate second coded NCPs and second coded NCP CRC bits (block 931). The method 902 continues by transmitting second one or more OFDM symbols to another communication device via a communication interface of the communication device (block 941). The second one or more OFDM symbols include the second coded NCPs and the second coded NCP CRC bits to indicate beginnings of second one or more codewords within one or both of the second one or more OFDM symbols and second one or more additional OFDM symbols.

The method 902 operates on different numbers of NCPs at different times when generating different OFDM or OFDMA symbols. Different signals may include different numbers of codewords that are indicated and identified based on different numbers of NCPs.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   a communication interface; and
   a processor configured to:
   encode one or more next codeword pointers (NCPs) using a forward error correction (FEC) code to generate one or more coded NCPs;
   encode the one or more NCPs using a cyclic redundancy check (CRC) code to generate NCP CRC bits;
   encode the NCP CRC bits using the FEC to generate coded NCP CRC bits; and
   transmit one or more orthogonal frequency division multiplexing (OFDM) symbols to another communication device via the communication interface, wherein the one or more OFDM symbols include the one or more coded NCPs and the coded NCP CRC bits to indicate beginnings of one or more codewords within at least one of the one or more OFDM symbols or one or more additional OFDM symbols.

2. The communication device of claim 1, wherein the processor is further configured to:
   encode one or more other NCPs using the FEC code to generate one or more other coded NCPs, wherein the one or more other NCPs includes a different number of NCPs than the one or more NCPs;
   encode the one or more other NCPs using the CRC code to generate other NCP CRC bits;
   encode the other NCP CRC bits using the FEC to generate other coded NCP CRC bits; and
   transmit first one or more OFDM symbols, via the communication interface, that includes the one or more other coded NCPs and the other coded NCP CRC bits to indicate beginnings of one or more other codewords within at least one of the first one or more OFDM symbols or second one or more OFDM symbols.

3. The communication device of claim 1, wherein the processor is further configured to:
encode the one or more NCPs using a first low density parity check (LDPC) code to generate the one or more coded NCPs;
encode the NCP CRC bits using the first LDPC code to generate the coded NCP CRC bits; and
encode a plurality of information bits using a second LDPC code to generate the one or more codewords.

4. The communication device of claim 1, wherein the processor is further configured to:
process the one or more coded NCPs and the coded NCP CRC bits using 64 quadrature amplitude modulation (QAM) modulation to generate NCP modulation symbols; and
transmit the NCP modulation symbols, via the communication interface, using a subset of sub-carriers of the one or more OFDM symbols.

5. The communication device of claim 1, wherein the processor is further configured to:
encode the one or more NCPs using a one-half rate low density parity check (LDPC) code to generate the one or more coded NCPs, wherein each of the one or more NCPs includes 24 bits and each of the one or more coded NCPs includes 48 bits; and
encode the NCP CRC bits using the one-half rate LDPC code to generate the coded NCP CRC bits, wherein the NCP CRC bits includes 24 bits and the coded NCP CRC bits include 48 bits, and wherein the one or more coded NCPs and the coded NCP CRC bits include a number of bits between 96 and 576 bits inclusive.

6. The communication device of claim 1 further comprising:
a cable headend transmitter or a cable modem termination system (CMTS), wherein the other communication device is a cable headend transmitter or a cable modem termination system (CMTS).

7. The communication device of claim 1 further comprising:
a cable modem, wherein the other communication device is a cable headend transmitter or a cable modem termination system (CMTS).

8. The communication device of claim 1 further comprising:
the communication interface configured to support communications within at least one of a satellite communication system, a wireless communication system, a wired communication system, a fiber-optic communication system, or a mobile communication system.

9. A communication device comprising:
a communication interface; and
a processor configured to:
encode first one or more next codeword pointers (NCPs) using a LDPC code to generate first one or more coded NCPs;
encode the first one or more NCPs using a cyclic redundancy check (CRC) code to generate first NCP CRC bits;
encode the first NCP CRC bits using the LDPC code to generate first coded NCP CRC bits;
transmit first one or more orthogonal frequency division multiplexing (OFDM) symbols to another communication device via the communication interface, wherein the first one or more OFDM symbols include the first one or more coded NCPs and the first coded NCP CRC bits to indicate beginnings of first one or more codewords within at least one of the first one or more OFDM symbols or second additional OFDM symbols;
encode second one or more NCPs using the LDPC code to generate second one or more coded NCPs;
encode the second one or more NCPs using the CRC code to generate second NCP CRC bits;
encode the second NCP CRC bits using the LDPC to generate second coded NCP CRC bits; and
transmit third one or more OFDM symbols to the other communication device via the communication interface, wherein the third one or more OFDM symbols include the second one or more coded NCPs and the second coded NCP CRC bits to indicate beginnings of second one or more codewords within at least one of the third one or more OFDM symbols or fourth additional OFDM symbols.

10. The communication device of claim 9, wherein the processor is further configured to:
encode first plurality of information bits using another LDPC code to generate the first one or more codewords; and
encode second plurality of information bits using the other LDPC code to generate the second one or more codewords.

11. The communication device of claim 9, wherein the processor is further configured to:
encode the first one or more NCPs using a one-half rate LDPC code to generate the first one or more coded NCPs, wherein each of the first one or more NCPs includes 24 bits and each of the first one or more coded NCPs includes 48 bits;
encode the first one or more NCPs using the CRC code to generate the first NCP CRC bits, wherein the first NCP CRC bits includes 24 bits; and
encode the first NCP CRC bits using the one-half rate LDPC code to generate the first coded NCP CRC bits, wherein the first coded NCP CRC bits include 48 bits, and wherein the first one or more coded NCPs and the first coded NCP CRC bits include a first number of bits between 96 and 576 bits inclusive;
encode the second one or more NCPs using a one-half rate LDPC code to generate the second one or more coded NCPs, wherein each of the second one or more NCPs includes 24 bits and each of the second one or more coded NCPs includes 48 bits;
encode the second one or more NCPs using the CRC code to generate the second NCP CRC bits, wherein the second NCP CRC bits includes 24 bits; and
encode the second NCP CRC bits using the one-half rate LDPC code to generate the second coded NCP CRC bits, wherein the second coded NCP CRC bits include 48 bits, and wherein the second one or more coded NCPs and the second coded NCP CRC bits include a second number of bits between 96 and 576 bits inclusive.

12. The communication device of claim 9 further comprising:
a cable modem, wherein the other communication device is a cable headend transmitter or a cable modem termination system (CMTS).

13. The communication device of claim 9 further comprising:

the communication interface configured to support communications within at least one of a satellite communication system, a wireless communication system, a wired communication system, a fiber-optic communication system, or a mobile communication system.

14. A method for execution by a communication device, the method comprising:
- encoding one or more next codeword pointers (NCPs) using a forward error correction (FEC) code to generate one or more coded NCPs;
- encoding the one or more NCPs using a cyclic redundancy check (CRC) code to generate NCP CRC bits;
- encoding the NCP CRC bits using the FEC to generate coded NCP CRC bits; and
- transmitting one or more orthogonal frequency division multiplexing (OFDM) symbols to another communication device via a communication interface of the communication device, wherein the one or more OFDM symbols include the one or more coded NCPs and the coded NCP CRC bits to indicate beginnings of one or more codewords within at least one of the one or more OFDM symbols or one or more additional OFDM symbols.

15. The method of claim 14 further comprising:
- encoding one or more other NCPs using the FEC code to generate one or more other coded NCPs, wherein the one or more other NCPs includes a different number of NCPs than the one or more NCPs;
- encoding the one or more other NCPs using the CRC code to generate other NCP CRC bits;
- encoding the other NCP CRC bits using the FEC to generate other coded NCP CRC bits; and
- transmitting first one or more OFDM symbols, via the communication interface, that includes the one or more other coded NCPs and the other coded NCP CRC bits to indicate beginnings of one or more other codewords within at least one of the first one or more OFDM symbols or second one or more OFDM symbols.

16. The method of claim 14 further comprising:
- encoding the one or more NCPs using a first low density parity check (LDPC) code to generate the one or more coded NCPs;
- encoding the NCP CRC bits using the first LDPC code to generate the coded NCP CRC bits; and
- encoding a plurality of information bits using a second LDPC code to generate the one or more codewords.

17. The method of claim 14 further comprising:
- processing the one or more coded NCPs and the coded NCP CRC bits using 64 quadrature amplitude modulation (QAM) modulation to generate NCP modulation symbols; and
- transmit the NCP modulation symbols, via the communication interface, using a subset of sub-carriers of the one or more OFDM symbols.

18. The method of claim 14 further comprising:
- encoding the one or more NCPs using a one-half rate low density parity check (LDPC) code to generate the one or more coded NCPs, wherein each of the one or more NCPs includes 24 bits and each of the one or more coded NCPs includes 48 bits; and
- encoding the NCP CRC bits using the one-half rate LDPC code to generate the coded NCP CRC bits, wherein the NCP CRC bits includes 24 bits and the coded NCP CRC bits include 48 bits, and wherein the one or more coded NCPs and the coded NCP CRC bits include a number of bits between 96 and 576 bits inclusive.

19. The method of claim 14, wherein the communication device is a cable modem, and the other communication device is a cable headend transmitter or a cable modem termination system (CMTS).

20. The method of claim 14 further comprising:
- operating the communication interface of the communication device to support communications within at least one of a satellite communication system, a wireless communication system, a wired communication system, a fiber-optic communication system, or a mobile communication system.

* * * * *